United States Patent
Wang et al.

(10) Patent No.: US 9,373,413 B2
(45) Date of Patent: Jun. 21, 2016

(54) SHIFT REGISTER UNIT, SHIFT REGISTER CIRCUIT, ARRAY SUBSTRATE AND DISPLAY DEVICE

(71) Applicant: BEIJING BOE OPTOELECTRONICS TECHNOLOGY CO., LTD., Beijing (CN)

(72) Inventors: Shijun Wang, Beijing (CN); Xue Dong, Beijing (CN); Xi Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 229 days.

(21) Appl. No.: 14/127,240

(22) PCT Filed: Nov. 23, 2012

(86) PCT No.: PCT/CN2012/085213
§ 371 (c)(1),
(2) Date: Dec. 18, 2013

(87) PCT Pub. No.: WO2013/131381
PCT Pub. Date: Sep. 12, 2013

(65) Prior Publication Data
US 2014/0192039 A1    Jul. 10, 2014

(30) Foreign Application Priority Data
Mar. 9, 2012    (CN) .......................... 2012 1 0061505

(51) Int. Cl.
| G11C 19/28 | (2006.01) |
| G09G 3/20 | (2006.01) |
| G09G 3/36 | (2006.01) |
| G09G 5/18 | (2006.01) |

(52) U.S. Cl.
CPC *G11C 19/28* (2013.01); *G09G 3/20* (2013.01); *G09G 3/3674* (2013.01); *G09G 5/18* (2013.01); *G09G 2310/0267* (2013.01); *G09G 2310/0283* (2013.01); *G09G 2310/0286* (2013.01)

(58) Field of Classification Search
CPC ......... G09G 3/3674; G09G 5/18; G09G 3/20; G09G 2310/0267; G09G 2310/0283; G09G 2310/0286; G11C 19/28
See application file for complete search history.

(56) References Cited

U.S. PATENT DOCUMENTS

| 8,019,039 B1 | 9/2011 | Tsai | |
| 2002/0105510 A1* | 8/2002 | Tsuchiya | G09G 3/3625 345/211 |

(Continued)

FOREIGN PATENT DOCUMENTS

| CN | 1725287 A | 1/2006 |
| CN | 101937718 A | 1/2011 |

(Continued)

OTHER PUBLICATIONS

PCT Written Opinion of the International Search Authority for PCT/CN2012/085213; mailed Mar. 7; 5 pages.

(Continued)

*Primary Examiner* — Kumar Patel
*Assistant Examiner* — Sejoon Ahn
(74) *Attorney, Agent, or Firm* — Ladas & Parry LLP (57) ABSTRACT

A shift register unit, a shift register circuit, an array substrate and a display device can avoid a phenomenon that light lines and dark lines appear alternately in a horizontal direction in a gray scale state when the display device is lighted up normally, wherein the phenomenon is generated because a clock signal causes an abnormal output of a gate scanning voltage of the shift register unit when a frame start signal comes. The shift register unit comprises a capacitor (C1), a first transistor (T1), a second transistor (T2), a third transistor (T3), a fourth transistor (T4), a fifth transistor (T5), a sixth transistor (T6), and a voltage pulling-down control module. The shift register unit, the shift register circuit, the array substrate and the display device can be used for the manufacture of a display.

14 Claims, 4 Drawing Sheets

(56) References Cited

U.S. PATENT DOCUMENTS

| | | | |
|---|---|---|---|
| 2003/0133621 A1* | 7/2003 | Fujii | G06F 15/8023 |
| | | | 382/257 |
| 2006/0001637 A1* | 1/2006 | Pak | G09G 3/3677 |
| | | | 345/100 |
| 2007/0248204 A1* | 10/2007 | Tobita | G11C 19/28 |
| | | | 377/64 |
| 2007/0274433 A1* | 11/2007 | Tobita | G09G 3/3677 |
| | | | 377/64 |
| 2011/0148853 A1 | 6/2011 | Ko | |
| 2012/0113088 A1 | 5/2012 | Han et al. | |

FOREIGN PATENT DOCUMENTS

| | | |
|---|---|---|
| CN | 102012591 A | 4/2011 |
| CN | 102237029 A | 11/2011 |
| CN | 102682727 A | 9/2012 |
| JP | 2009-092982 | 4/2009 |

OTHER PUBLICATIONS

English language translation of the PCT International Preliminary Report on Patentability and the PCT Written Opinion of the International Search Authority for PCT/CN2012/085213; mailed Mar. 7, 2013; 9 pages.
English language Abstract of CN102012591A; 2 pages.
English language Abstract of CN101937718A; 1 page.
First Office Action issued by the Chinese Patent Office for Chinese Patent Application No. 201210061505.X dated May 30, 2013, 7pgs.
English translation of First Office Action issued by the Chinese Patent Office for Chinese Patent Application No. 201210061505.X dated May 30, 2013, 6pgs.
Second Office Action issued by the Chinese Patent Office for Chinese Patent Application No. 201210061505.X dated Nov. 22, 2013, 7pgs.
English translation of Second Office Action issued by the Chinese Patent Office for Chinese Patent Application No. 201210061505.X dated Nov. 22, 2013, 5pgs.
Third Office Action issued by the Chinese Patent Office for Chinese Patent Application No. 201210061505.X dated Apr. 25, 2014, 5pgs.
English translation of Third Office Action issued by the Chinese Patent Office for Chinese Patent Application No. 201210061505.X dated Apr. 25, 2014, 3pgs.
International Preliminary Report on Patentability for International Application No. PCT/CN2012/085213 dated Sep. 9, 2014, 9pgs.
International Search Report for International Application No. PCT/CN2012/085213 issued Feb. 20, 2013, 14pgs.

* cited by examiner

SHIFT REGISTER UNIT, SHIFT REGISTER CIRCUIT, ARRAY SUBSTRATE AND DISPLAY DEVICE

CROSS REFERENCE TO RELATED APPLICATIONS

This application is based on International Application No. PCT/CN2012/085213 filed on Nov. 23, 2012, which claims priority to Chinese National Application No. 201210061505.X filed on Mar. 9, 2012, the contents of which are incorporated herein by reference.

TECHNICAL FIELD

The present disclosure relates to a field of liquid crystal display manufacture, and particularly, relates to a shift register unit, a shift register circuit, an array substrate and a display device.

BACKGROUND

In recent years, developments in displays present a development trend of high integrity and low cost. A very important technique among the developments is an implementation for mass production of GOA (Gate Driver on Array) technique. A gate switching circuit is integrated on an array substrate of a display panel by using the GOA technique to form a scan driving of the display panel, so that a gate driving integrate circuit part may be omitted. Thus, product cost may be reduced in terms of both material cost and manufacture process cost, and the display panel may be designed aesthetically with symmetrical sides and thin frame. Also, it benefits productivity and yield enhancement since a process for bonding in a gate direction may be omitted. The gate switching circuit integrated on the array substrate by using the GOA technique is also referred to as a GOA circuit or a shift register circuit. In addition, among current designs of mobile products, a GOA circuit with a bi-directional scan has become a focus of customer needs.

A bi-directional scan shift register circuit comprises several shift register units, each of the shift register units corresponds to one gate line. Specifically, an output terminal of each of the shift register units is connected with one gate line and the output terminal of a shift register unit is connected to an input terminal of a next shift register unit, except the first shift register unit and the last shift register unit. Each shift register unit in a traditional bi-directional scan shift register circuit has a 10TFT (Thin Film Transistor) 1Cap (capacitor) structure. The inventor found that, in the shift register with such a structure, a gate voltage at a gate driving TFT is pulled-up by a signal clock at a source of the gate driving TFT when a STV (Frame Start) signal is input, because the gate driving TFR has a large parasitic capacitance, which causes a capacitive coupling of the output signal of the shift register unit and then generates an abnormal output, and in turn a H-line Mura, i.e. a phenomenon in which light lines and dark lines appear alternately in a horizontal direction in a gray scale state when the display panel is lighted normally, occurs in the display panel.

SUMMARY

Embodiments of the present disclosure provide a shift register unit, a shift register circuit, an array substrate and a display device, which can avoid a phenomenon that light lines and dark lines appear alternately in a horizontal direction in a gray scale state when the display device is lighted up normally, wherein the phenomenon is generated because a clock signal causes an abnormal output of a gate scanning voltage of the shift register unit when a frame start signal comes.

According to an aspect of the present disclosure, an embodiment of the present disclosure provide a shift register unit, comprising:

a capacitor having two electrodes, a first electrode of the two electrodes being connected with an output terminal;

a first transistor, a gate thereof being connected with a signal input terminal, a drain thereof being connected with a first level terminal, and a source thereof being connected with a second electrode of the capacitor;

a second transistor, a gate thereof being connected with a resetting terminal, a drain thereof being connected with the source of the first transistor, and a source thereof being connected with a second level terminal;

a third transistor, a gate thereof being connected with the source of the first transistor, a drain thereof being connected with a first clock signal terminal, and a source thereof being connected with the output terminal;

a fourth transistor, a gate thereof being connected with a second clock signal terminal, a drain thereof being connected with the output terminal, and a source thereof being connected with a low level terminal;

a fifth transistor, a drain thereof being connected with the drain of the second transistor, and a source thereof being connected with the low level terminal;

a sixth transistor, a gate thereof being connected with a gate of the fifth transistor, a drain thereof being connected with the drain of the fourth transistor, and a source thereof being connected with the source of the fourth transistor;

a voltage pulling-down control module connected with the second clock signal terminal, the low level terminal, the gate of the fifth transistor, the source of the first transistor, a frame start signal and a third level terminal, wherein in the case that the frame start signal terminal and the third level terminal of the voltage pulling-down module are at high levels simultaneously, the voltage pulling-down control module outputs a high level at the gate of the fifth transistor, and the fifth transistor is in a turn-on state so as to pull down a gate voltage of the third transistor, and the sixth transistor is also in the turn-on state so as to pull down a voltage at the output terminal.

According to another aspect of the present disclosure, an embodiment of the present disclosure provides a shift register circuit comprising a plurality of the above shift register units connected in cascade, and except for a first shift register unit and a last shift register unit, the output terminal of each of the remaining shift register units is connected with the signal input terminal of the next shift register unit adjacent thereto, the resetting terminal of each of the remaining shift register units is connected with the output terminal of a next shift register unit adjacent thereto, and the frame start signal terminal of each of the remaining shift register units is connected with the respective third level terminal, the third level terminal of the first shift register unit is connected with the second level terminal, the resetting terminal of the first shift register unit is connected with the output terminal of the next shift register unit adjacent thereto, and the third level terminal of the last shift register unit is connected with the first level terminal.

According to a still another aspect of the present disclosure, an embodiment of the present disclosure provides an array substrate on which a shift register circuit is formed, and the shift register circuit is the shift register circuit described above.

According to a further aspect of the present disclosure, an embodiment of the present disclosure provides a display device, comprising:

a display area having a plurality of pixels for displaying an image;

a shift register circuit for transferring a scanning signal to the display area; and a data driving circuit for transferring a data signal to the display area.

Wherein the shift register circuit is the shift register circuit described above.

The shift register unit, the shift register circuit, the array substrate and the display device provided in the embodiments of the present disclosure can avoid a phenomenon that light lines and dark lines appear alternately in a horizontal direction in a gray scale state when the display device is lighted up normally, wherein the phenomenon is generated because a clock signal causes an abnormal output of a gate scanning voltage of the shift register unit when a frame start signal comes.

BRIEF DESCRIPTION OF THE DRAWINGS

In order to more clearly illustrate embodiments of the disclosure or technical solutions in the prior art, drawings required for a description of the embodiments or the prior art will be described briefly. Apparently, the drawings in the following description are only some embodiments of the present disclosure, and those of ordinary skill in the art may obtain other drawings based on these drawings without creative labors.

DETAILED DESCRIPTION

Solutions in the embodiments of the present disclosure will be described clearly and completely below in conjunction with the accompanying drawings of the embodiments of the present disclosure. It is obvious that the described embodiments are only part of the embodiments of the present disclosure, but not all the embodiments. Based on the embodiments of the present disclosure, other embodiments obtained by those ordinary skilled in the art without creative labors would belong to the protection scope of the present disclosure.

Transistors utilized in all embodiments of the present disclosure may be thin film transistors or FET transistors, or other devices having same features. A drain and a source of the transistor used here are symmetrical, so the drain and the source have no difference. In the embodiments of the present disclosure, to distinguish between the two electrodes other than a gate of the transistor, one is referred to as a drain, and the other is referred as a source. In the drawings, the upper terminal of a transistor is defined as the drain, the intermediate terminal is defined as the gate, and the lower terminal is defined as the source.

Figure 1:
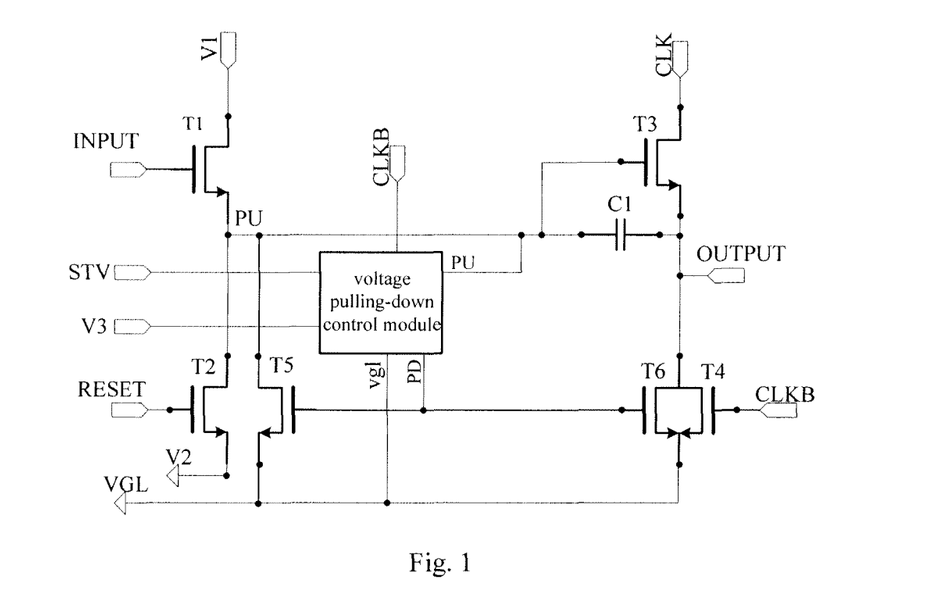
FIG. 1 is a schematic diagram illustrating a circuit structure of a shift register unit according to an embodiment of the present disclosure.

FIG. 1 is a schematic diagram of a shift register unit according to an embodiment of the present disclosure, the shift register unit comprises: a capacitor C1, a first transistor T1, a second transistor T2, a third transistor T3, a fourth transistor T4, a fifth transistor T5, a sixth transistor T6 and a voltage pulling-down control module. Also, a signal input terminal of the shift register in FIG. 1 is INPUT, an output terminal is OUTPUT, a resetting terminal is RESET; a first clock signal terminal is CLK, a second clock signal terminal is CLKB, a first level terminal is V1, a second level terminal is V2, a third level terminal is V3, a low level terminal is VGL, and STV is a frame start signal terminal. Further, the transistor T3 is a driving TFT, PU is a node voltage corresponding to a gate of the transistor T3, and PD is a node voltage at gates of the voltage pulling-down transistors T5 and T6.

The embodiment of the present disclosure considers the shift register unit illustrated in FIG. 1 as a current shift register unit, and connection relationships among respective components therein are described below in detail;

the capacitor C1 has two electrodes, and a first electrode of the two electrodes is connected with the output terminal OUTPUT;

a gate of the transistor T1 is connected with the signal input terminal INPUT, a drain of the transistor T1 is connected with the first level terminal V1, and a source of the transistor T1 is connected with a second electrode of the capacitor C1;

a gate of the transistor T2 is connected with the resetting terminal RESET, a drain of the transistor T2 is connected with the source of the transistor T1, and a source of the transistor T2 is connected with the second level terminal V2;

a gate of the transistor T3 is connected with the source of the transistor T1, a drain of the transistor T3 is connected with the first clock signal terminal CLK, and a source of the transistor T3 is connected with the output terminal OUTPUT;

a gate of the transistor T4 is connected with the second clock signal terminal CLKB, a drain of the transistor T4 is connected with the output terminal OUTPUT, and a source of the transistor T4 is connected with the low level terminal VGL;

a drain of the transistor T5 is connected with the drain of the transistor T2, and a source of the transistor T5 is connected with the low level terminal VGL;

a gate of the transistor T6 is connected with a gate of the transistor T5, a drain of the transistor T6 is connected with the drain of the transistor T4, and a source of the transistor T6 is connected with the source of the transistor T4;

the voltage pulling-down control module is connected with the second clock signal terminal CLKB, the low level terminal VGL, the gate of the transistor T5, the source of the transistor T1, the frame start signal STV and the third level terminal V3, wherein in the case that the frame start signal terminal STV and the third level terminal V3 of the voltage pulling-down module are at high levels simultaneously, the voltage pulling-down control module outputs a high level at the gate of the fifth transistor T5, and at this time, the fifth transistor T5 is in a turn-on state so as to pull down a gate voltage of the third transistor T3; and the sixth transistor T6 is also in the turn-on state so as to pull down a voltage at the output terminal OUTPUT.

The shift register unit provided in the embodiment of the present disclosure can avoid a phenomenon that light lines and dark lines appear alternately in a horizontal direction in a gray scale state when the display device is lighted up normally, and the phenomenon is generated because the first clock signal CLK causes an abnormal output of a gate scanning voltage of the shift register unit when a frame start signal comes in the frame start signal terminal STV.

Figure 2:
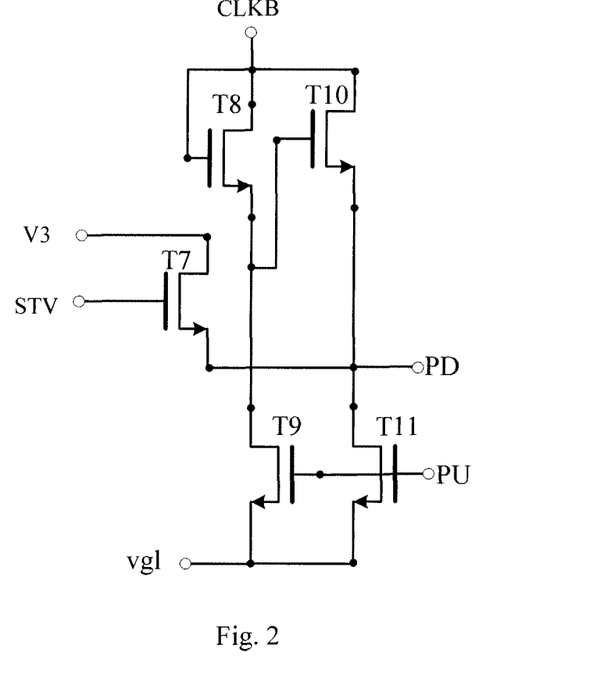
FIG. 2 is a schematic diagram illustrating a circuit structure of a voltage pulling-down control module according to the embodiment of the present disclosure.

Optionally, FIG. 2 is a schematic diagram of the voltage pulling-down control module according to the embodiment of the present disclosure, and detailed connection relationships among respective electric components are as follows:

a gate of a transistor T7 is connected with the frame start signal terminal STV, and a drain of a transistor T7 is connected with the third level terminal V3;

a gate and a drain of a transistor T8 are connected with the second clock signal CLKB;

a gate of a transistor T9 is connected with the source of the transistor T1, a drain of the transistor T9 is connected with a source of the transistor T8, and a source of the transistor T9 is connected with the low level terminal VGL;

a gate of a transistor T10 is connected with the source of the transistor T8, a drain of the transistor T10 is connected with the second clock signal CLKB, and a source of the transistor T10 is connected with a source of the transistor T7;

a gate of a transistor T11 is connected with the gate of the transistor T9, a drain of the transistor T11 is connected with the source of the transistor T10, and a source of the transistor T11 is connected with the low level terminal VGL.

Another embodiment of the present disclosure provides a shift register circuit comprising a plurality of the above shift register units connected in cascade. Except for a first shift register unit and a last shift register unit, the output terminal of each of the remaining shift register units is connected with the signal input terminal of a next shift register unit adjacent thereto, the resetting terminal of each of the remaining shift register units is connected with the output terminal of the next shift register unit adjacent thereto, and the frame start signal terminal of each of the remaining shift register units is connected with the respective third level terminal; wherein, the third level terminal of the first shift register unit is connected with the second level terminal, the resetting terminal of the first shift register unit is connected with the output terminal of the next shift register unit adjacent thereto, and the third level terminal of the last shift register unit is connected with the first level terminal.

The shift register circuit provided in the embodiment of the present disclosure can avoid a phenomenon that light lines and dark lines appear alternately in a horizontal direction in a gray scale state when the display device is lighted up normally, wherein the phenomenon is generated because the first clock signal CLK causes an abnormal output of a gate scanning voltage of the shift register unit when a frame start signal comes in the frame start signal terminal STV.

Further, the clock signals at the first clock signal terminals of the adjacent shift register units have a phase difference of 180°, and the clock signals at the second clock signal terminals of the adjacent shift register units have a phase difference of 180°.

Figure 3:
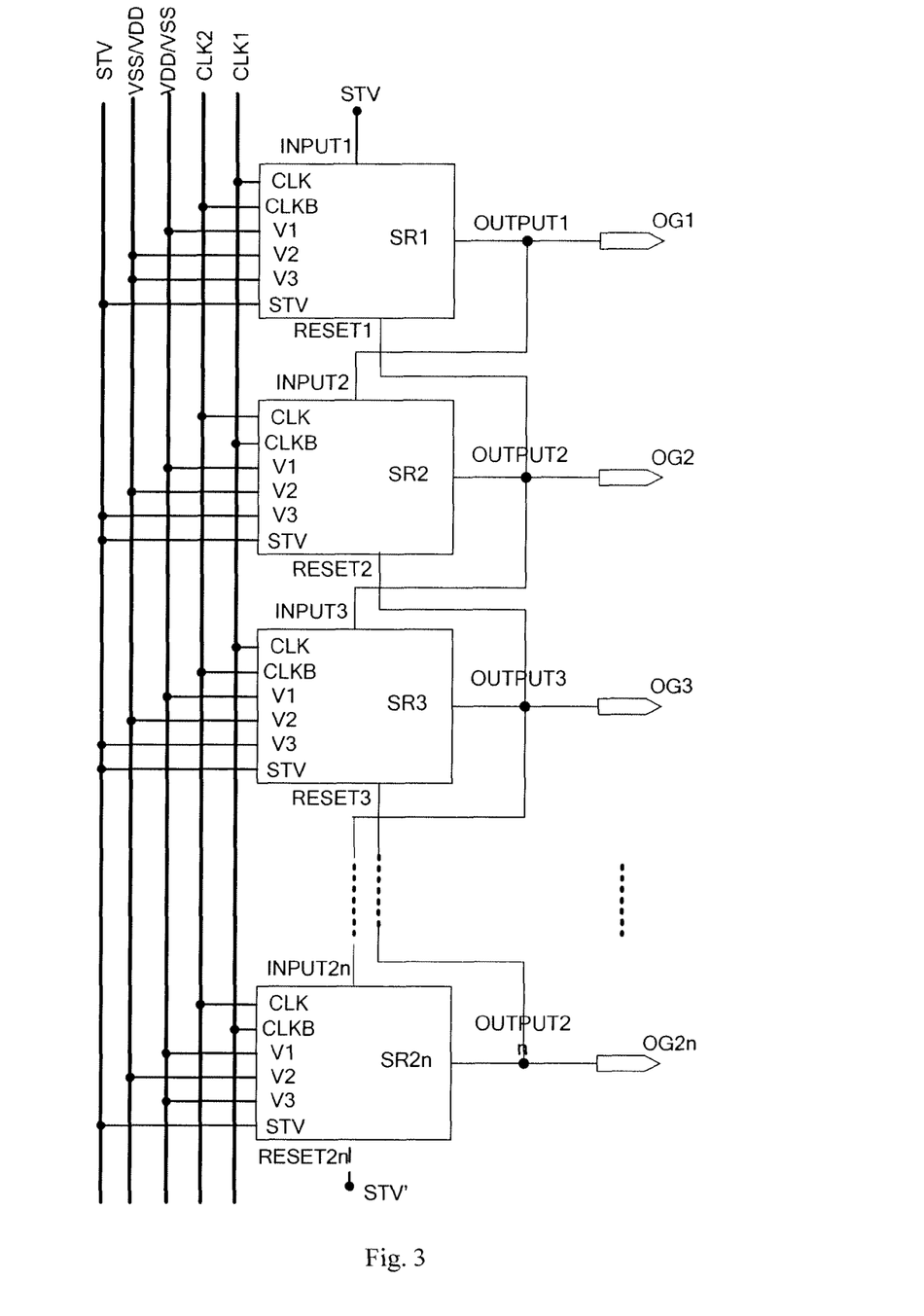
FIG. 3 is a schematic diagram illustrating a circuit structure of a shift register circuit according to the embodiment of the present disclosure.

Specifically, as shown in FIG. 3, a shift register circuit comprises several shift register units, wherein an output terminal OUTPUT1 of a shift register unit SR1 is connected with an signal input terminal INPUT2 of a shift register unit SR2 and a gate line OG1, a resetting terminal RESET1 of the shift register unit SR1 is connected with an output terminal OUTPUT2 of the shift register unit SR2; the output terminal OUTPUT2 of the shift register unit SR2 is connected with an signal input terminal INPUT3 of a shift register unit SR3 and a gate line OG2, a resetting terminal RESET2 of the shift register unit SR2 is connected with an output terminal OUTPUT3 of the shift register unit SR3; and other shift register units are connected in the similar way. Furthermore, each of the shift register units has a first clock signal terminal CLK and a second clock signal terminal CLKB for input; wherein in two adjacent shift register units, a first clock signal terminal CLK of one shift register unit is connected with a system clock signal CLK1, and a second clock signal terminal CLKB of the shift register is connected with a system clock CLK2, while a first clock signal terminal CLK of the other shift register unit is connected with the system clock signal CLK2, and a second clock signal terminal CLKB of the other shift register is connected with the system clock CLK1. Herein, a clock signal at the second clock signal terminal and a clock signal at the first clock signal terminal has a phase difference of 180°, and both of the clock signal at the first clock signal terminal and the clock signal at the second clock signal terminal output high levels during one half of their respective operation periods of time, and output low levels during the other half of their respective operation periods of time. Furthermore, each of the shift register units has a first level terminal V1 and a second level terminal V2, wherein the first level terminal V1 is connected with VDD/VSS level, and the second level terminal V2 is connected with VSS/VDD level. In the present embodiment, the shift register circuit may realize a bi-directional scan. When it scans forwards, the VDD/VSS level is at a high level, and the VSS/VDD level is at a low level. At this time, for each of the shift register units in odd rows, the high level signal at the first clock signal terminal is input after the high level signal at the frame start signal terminal STV comes, and the high level signal at the second clock signal terminal is input after the high level signal at the first clock signal terminal ends; for each of the shift register units in even rows, the first clock signal terminal thereof is input with the clock signal at the second clock signal terminal of the shift register unit in the odd row, and the second clock signal terminal thereof is input with the clock signal at the first clock signal terminal of the shift register unit in the odd row. When the shift register circuit scans backwards, the VDD/VSS level is at the low level, and the VSS/VDD level is at the high level. At this time, for each of the shift register units in odd rows, the high level signal at the second clock signal terminal is input after the high level signal at the frame start signal terminal STV comes, and the high level signal at the first clock signal terminal is input after the high level signal at the second clock signal terminal ends; for each of the shift register units in even rows, the second clock signal terminal thereof is input with the clock signal at the first clock signal terminal of the shift register unit in the odd row, and the first clock signal terminal thereof is input with the clock signal at the second clock signal terminal of the shift register unit in the odd row. Furthermore, each of the shift register units has the frame start signal terminal STV and a third level terminal V3. Except for the first shift register unit SR1 and the last shift register unit SR2n, the frame start signal terminals STV and the third level terminals V3 of all the remaining shift register units are connected with the frame start signal STV. The frame start signal terminal STV of the shift register unit SR1 is connected with the frame start signal STV, and the third level terminal V3 thereof is connected with the second level terminal V2; the frame start signal terminal STV of the shift register unit SR2n is connected with the frame start signal STV, and the third level terminal V3 thereof is connected with the first level terminal V1. The first shift register unit is the shift register unit SR1, and the last shift register unit is the shift register unit SR2n, then in the case of scanning forwards, the input signal INPUT1 of the shift register unit SR1 may be an active pulse signal, which, for example, may be the frame start signal STV; and in the case of scanning backwards, the resetting terminal RESET of the shift register unit SR2n may be a signal input terminal and an active pulse signal is input, the active pulse signal may be a frame start signal STV' for example (at this time, functions for the signal input terminal and the resetting terminal of each of the shift register units are converted, that is to say, as compared with a forward scan, the resetting terminal of each of the shift register units becomes the signal input terminal and the original signal input terminal of each of the shift register units becomes the resetting terminal when the scan is performed backwards, and the connection relationships of the circuit do not change, only the functions of the circuit are converted).

Figure 4:
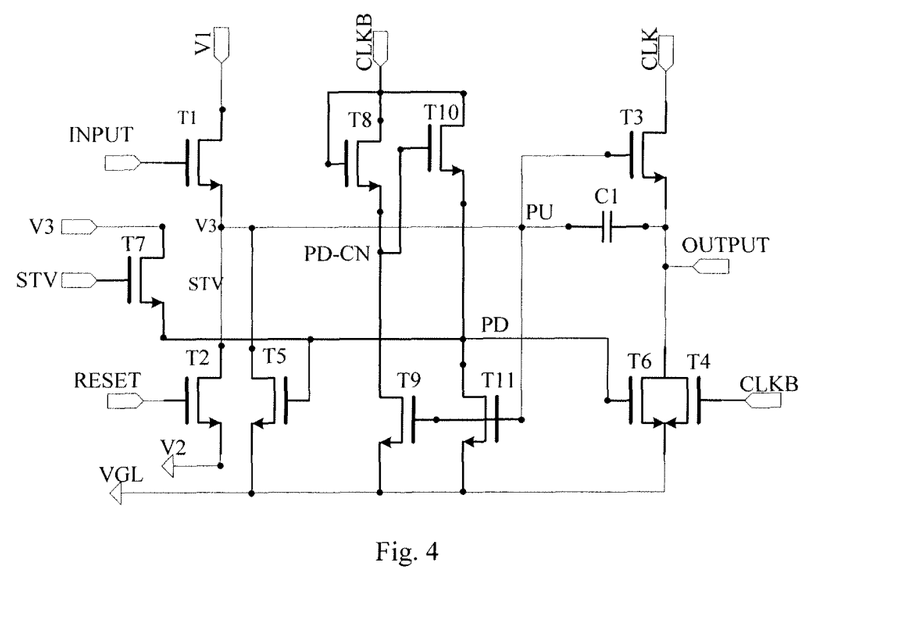
FIG. 4 is a schematic diagram illustrating a circuit structure of a shift register unit according to another embodiment of the present disclosure.
Figure 5:
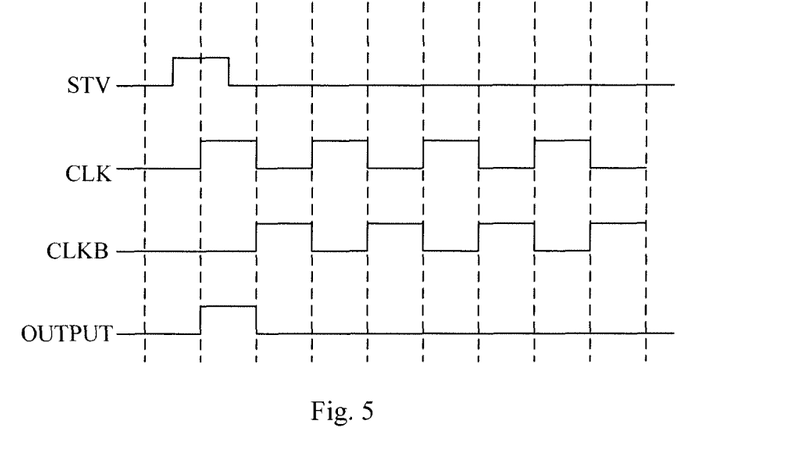
FIG. 5 is a schematic diagram illustrating a timing state when the shift register unit outputs according to an embodiment of the present disclosure.
Figure 6:
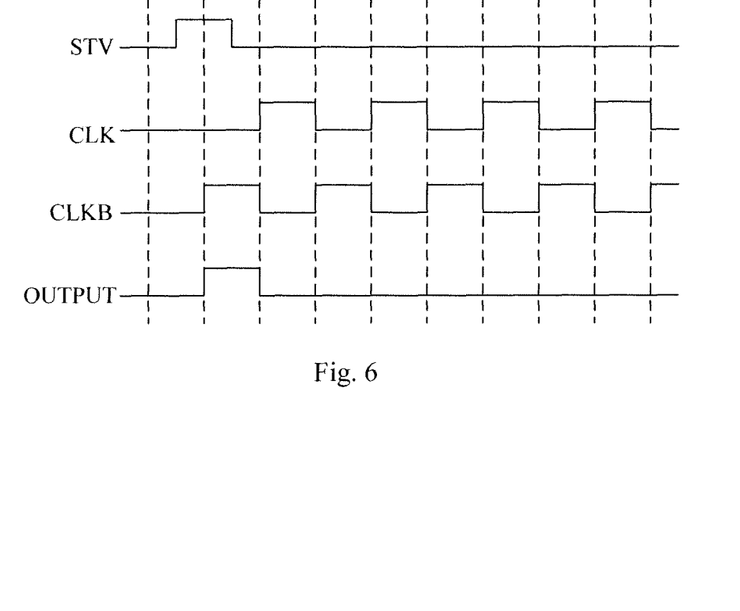
FIG. 6 is a schematic diagram illustrating another timing state when the shift register unit outputs according to the embodiment of the present disclosure.
Figure 7:
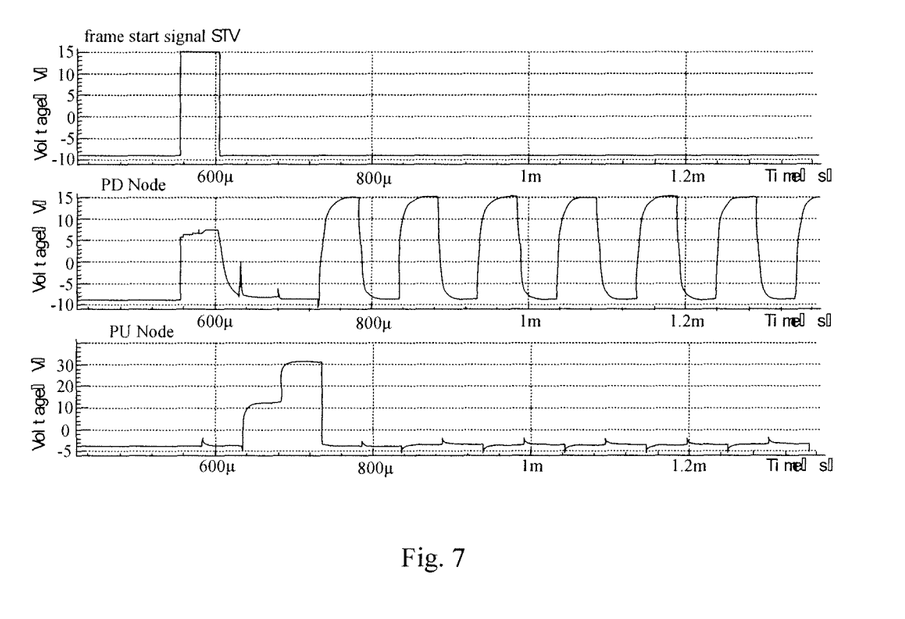
FIG. 7 is a schematic diagram illustrating waveforms of a frame start signal, signals at PD node and PU node in the shift register unit according to the embodiments of the present disclosure.

Functions implemented by the shift register unit and the shift register circuit according to the embodiments of the present disclosure are as follows in connection with FIG. 4, FIG. 5, FIG. 6 and FIG. 7, wherein FIG. 4 provides a circuit diagram of the shift register circuit, FIGS. 5 and 6 provide timing state diagrams of the shift register unit (wherein FIG. 5 is the timing state diagram of signals at respective signal terminals STV, CLK, CLKB, OUTPUT when the scan is performed forwards; while FIG. 6 is the timing state diagram for signals at respective signal terminals STV, CLK, CLKB, OUTPUT when the scan is performed backwards), FIG. 7 provides a schematic diagram illustrating waveforms of the frame start signal, signals at PD node and PU node in the shift register unit.

Firstly, the current shift register unit uses transistors T1~T4 and capacitor C1 to achieve an essential function of shift and registering: when the signal input terminal INPUT is at the high level, T1 is turned on to charge the PU node, and when the first clock signal terminal CLK is at the high level, T3 is turned on so the output terminal OUTPUT outputs the high level, and at the same time a potential at PU is further pulled up by means of a bootstrap effect of the capacitor C1; when the next shift register unit outputs the high level, the signal at the resetting terminal RESET of the current shift register unit turns on T2 and thus pulls down a voltage at the PU node, at the same time the second clock signal terminal CLKB inputs the high level to turn on T4 and thus a voltage at the output terminal OUTPUT is pulled down, and the capacitor C1 discharges the PU node and the output terminal OUTPUT; the first level terminal V1 and the second level terminal V2 in the circuit may implement a conversion between the high level and the low level as scanning forwards and backwards, in order to realize the bi-direction scan. T1 and T2 are designed as having the same size so as to ensure a consistency in the forward scan and the backward scan.

In case of the forward scan, for all the shift register units except the first shift register unit and the last shift register unit in the entire shift register circuit, the frame start signal terminals STV and the third level terminals V3 thereof are connected with a frame start signal STV provided by the system simultaneously. Thus, when the frame start signal terminal STV is at the high level (refer to the frame start signal terminal STV at the high level as illustrated in FIG. 5 and FIG. 7), T7 pulls up a potential at the PD node, at this time T5 and T6 are turned on because the PD node is the gate of T5 and the gate of T6. The PU node then discharges via T5 and functions to pull down the voltage, thereby an abnormal output from the terminal OUTPUT caused by the raised voltage at the PU node may be avoided, wherein the raised voltage at the PU node is a result of the coupled bootstrap of C1 generated because of the high level of CLK. At the same time, the terminal OUTPUT discharges via T6, which also has the function of pulling down the voltage. Thus, the H-line mura problem can be settled effectively.

Specifically, in order to ensure the entire shift register circuit may operate normally, when it scans forwards, the third level terminal V3 (that is, the drain of T7) of the first shift register unit in the shift register circuit is connected with the second level terminal V2. Since the VSS/VDD level connected with the second level terminal V2 is at the low level at this time, the PD node in the first shift register unit is still at the low level in the case that the frame start signal STV reaches the frame start signal terminal STV, so that the PU node can not discharge via T5, which may ensure the signal at the PU node in the first row is normal, rendering the first shift register unit outputs normally. Furthermore, when it scans forwards, the third level terminal V3 (that is, the drain of T7) of the last shift register unit in the shift register circuit is connected with the first level terminal V1. Since the VDDNSS level connected with the first level terminal V1 is at the high level at this time, the T7 has a same function as the middle shift register unit. PD node is also pulled up when the STV signal comes, because the drain of the T7 is connected with the high level, and thus T5 and T6 are turned on at this time because the PD node is the gate of T5 and the gate of T6. Therefore, PU node discharges via T5, which has a function of pulling down the voltage, and therefore an abnormal output from the terminal OUTPUT caused by the raised voltage at the PU node may be avoided, wherein the raised voltage at the PU node is a result of the coupled bootstrap of C1 generated because of the high level of CLK. At the same time, the terminal OUTPUT discharges via T6, which also has the function of pulling down the voltage. Thus, the H-line mura problem can be settled effectively.

Also, when it scans backwards, the connection structure in the shift register circuit does not change, and the only changes are as follows: the resetting terminal RESET for the forward scanning is converted to the signal input terminal INPUT' for the backward scanning, the signal input terminal INPUT for the forward scanning is converted to the resetting terminal RESET' for the backward scanning, the VDDNSS level is converted from the high level to the low level, the VSS/VDD level is converted from the low level to the high level, and referring to FIGS. 6 and 7 (waveforms of the PD node, the PU node and the frame start signal are unchanged because operation principles of the shift register unit are the same for both the forward scanning and the backward scanning, therefore, waveform diagrams illustrated in FIG. 7 are still taken as a reference herein), the middle shift register units still operate normally, but the last shift register unit for the forward scanning becomes the first shift register unit for the backward scanning, the PD node of the first shift register unit is still at the low level when the frame start signal terminal is input with the high level, so that the PU node can not discharge via T5 and it may ensure the signal at the PU node in the first row is normal, and then the first shift register unit may output normally; and, the first shift register unit for the forward scanning becomes the last shift register unit for the backward scanning, and since its operation principle is the same as that of the last shift register unit for the forward scanning, details are omitted herein.

Furthermore, an embodiment of the present disclosure provides an array substrate on which a shift register circuit is formed; and the shift register circuit is the shift register circuit described above.

An embodiment of the present disclosure further provides a display device, such as a display panel, comprising:

a display area having a plurality of pixels for displaying an image; a shift register circuit for transferring a scanning signal to the display area; and a data driving circuit for transferring a data signal to the display area. Wherein the shift register circuit is the shift register circuit described above. Additionally, the display device may be a display apparatus such as an electric paper, a mobile phone, a TV, a digital photo frame, and the like.

Ordinary skill in the art can be understood that all or part of the steps implementing the above method embodiments can be accomplished by a hardware relevant to programs and/or instructions, wherein the program may be stored in a computer readable storage medium, and the program, when executed, performs the steps including the above method embodiment; the storage media includes: ROM, RAM, disk or CD-ROM, and other media capable of storing program codes.

Above are only specific embodiments of the present disclosure, but the scope of the present disclosure is not limited thereto, and changes or replacements which can be conceived easily by any persons skilled in the art are covered within the scope sought for protection of the present disclosure. Thus, the scope of the invention should be defined by the claims.

What is claimed is:

1. A shift register unit, comprising: a capacitor having two electrodes, a first electrode of the two electrodes being directly connected with an output terminal;
   a first transistor, a gate thereof being directly connected with a signal input terminal, a drain thereof being directly connected with a first level terminal, and a source thereof being directly connected with a second electrode of the capacitor;
   a second transistor, a gate thereof being directly connected with a resetting terminal, a drain thereof being directly connected with the source of the first transistor, and a source thereof being directly connected with a second level terminal;
   a third transistor, a gate thereof being directly connected with the source of the first transistor, a drain thereof being directly connected with a first clock signal terminal, and a source thereof being directly connected with the output terminal;
   a fourth transistor, a gate thereof being directly connected with a second clock signal terminal, a drain thereof being directly connected with the output terminal, and a source thereof being directly connected with a low level terminal;
   a fifth transistor, a drain thereof being directly connected with the drain of the second transistor, and a source thereof being directly connected with the low level terminal;
   a sixth transistor, a gate thereof being directly connected with a gate of the fifth transistor, a drain thereof being directly connected with the drain of the fourth transistor, and a source thereof being directly connected with the source of the fourth transistor;
   a voltage pulling-down control module directly connected with the second clock signal terminal, the low level terminal, the gate of the fifth transistor, the source of the first transistor, a frame start signal terminal and a third level terminal, wherein in the case that the frame start signal terminal and the third level terminal of the voltage pulling-down module are at high levels simultaneously, the voltage pulling-down control module outputs a high level at the gate of the fifth transistor, and the fifth transistor is in a turn-on state so as to pull down a gate voltage of the third transistor, and the sixth transistor is also in the turn-on state so as to pull down a voltage at the output terminal.

2. The shift register unit of claim 1, wherein the voltage pulling-down control module comprises:
   a seventh transistor, a gate thereof being connected with the frame start signal terminal, and a drain thereof being connected with the third level terminal;
   an eighth transistor, a gate and a drain thereof being connected with the second clock signal terminal;
   a ninth transistor, a gate thereof being connected with the source of the first transistor, a drain thereof being connected with a source of the eighth transistor, and a source of the ninth transistor being connected with the low level terminal;
   a tenth transistor, a gate thereof being connected with the source of the eighth transistor, a drain thereof being connected with the second clock signal terminal, and a source thereof being connected with a source of the seventh transistor;
   an eleventh transistor, a gate thereof being connected with the gate of the ninth transistor, a drain of the eleventh transistor being connected with the source of the tenth transistor, and a source thereof being connected with the low level terminal.

3. The shift register unit of claim 1, wherein the first transistor has a same size as that of the second transistor.

4. The shift register unit of claim 3, wherein the second level terminal is at a low level when the first level terminal is at a high level, or the second level terminal is at the high level when the first level terminal is at the low level.

5. The shift register unit of claim 3, wherein a clock signal at the second clock signal terminal and a clock signal at the first clock signal terminal has a phase difference of 180°.

6. The shift register unit of claim 3, wherein both of the clock signal at the first clock signal terminal and the clock signal at the second clock signal terminal output high levels during one half of their respective operation periods of time, and output low levels during the other half of their respective operation periods of time.

7. A shift register circuit, comprising a plurality of shift register units directly connected in cascade, each of the shift register units comprising: a capacitor having two electrodes, a first electrode of the two electrodes being directly connected with an output terminal;
   a first transistor, a gate thereof being directly connected with a signal input terminal, a drain thereof being directly connected with a first level terminal, and a source thereof being directly connected with a second electrode of the capacitor;
   a second transistor, a gate thereof being directly connected with a resetting terminal, a drain thereof being directly connected with the source of the first transistor, and a source thereof being directly connected with a second level terminal;
   a third transistor, a gate thereof being directly connected with the source of the first transistor, a drain thereof being directly connected with a first clock signal terminal, and a source thereof being directly connected with the output terminal;
   a fourth transistor, a gate thereof being directly connected with a second clock signal terminal, a drain thereof being directly connected with the output terminal, and a source thereof being directly connected with a low level terminal;
a fifth transistor, a drain thereof being directly connected with the drain of the second transistor, and a source thereof being directly connected with the low level terminal;
a sixth transistor, a gate thereof being directly connected with a gate of the fifth transistor, a drain thereof being directly connected with the drain of the fourth transistor, and a source thereof being directly connected with the source of the fourth transistor;
a voltage pulling-down control module directly connected with the second clock signal terminal, the low level terminal, the gate of the fifth transistor, the source of the first transistor, a frame start signal terminal and a third level terminal, wherein in the case that the frame start signal terminal and the third level terminal of the voltage pulling-down module are at high levels simultaneously, the voltage pulling-down control module outputs a high level at the gate of the fifth transistor, and the fifth transistor is in a turn-on state so as to pull down a gate voltage of the third transistor, and the sixth transistor is also in the turn-on state so as to pull down a voltage at the output terminal,
wherein, for a group from a second shift register unit to a last but one shift register unit of the plurality of shift register units directly connected in cascade, the output terminal of each shift register unit of the group is directly connected with the signal input terminal of the next shift register unit adjacent thereto, the resetting terminal of each shift register unit of the group is directly connected with the output terminal of the next shift register unit adjacent thereto, and the frame start signal terminal of each shift register unit of the group is directly connected with the respective third level terminal, the third level terminal of a first shift register unit of the plurality of shift register units directly connected in cascade is directly connected with the second level terminal, the resetting terminal of the first shift register unit is directly connected with the output terminal of the next shift register unit adjacent thereto, and the third level terminal of a last shift register unit of the plurality of shift register units directly connected in cascade is directly connected with the first level terminal.

8. The shift register circuit of claim 7, wherein clock signals at the first clock signal terminals of the adjacent shift register units have a phase difference of 180°, and clock signals at the second clock signal terminals of the adjacent shift register units have a phase difference of 180°.

9. A display device, comprising:
a display area having a plurality of pixels for displaying an image;
a shift register circuit for transferring a scanning signal to the display area; and a data driving circuit for transferring a data signal to the display area,
wherein the shift register circuit comprises a plurality of shift register units directly connected in cascade, and each of the shift register units comprising:
a capacitor having two electrodes, a first electrode of the two electrodes is directly connected with an output terminal;
a first transistor, a gate thereof is directly connected with a signal input terminal, a drain thereof is directly connected with a first level terminal, and a source thereof is directly connected with a second electrode of the capacitor;
a second transistor, a gate thereof is directly connected with a resetting terminal, a drain thereof is directly connected with the source of the first transistor, and a source thereof is directly connected with a second level terminal;
a third transistor, a gate thereof is directly connected with the source of the first transistor, a drain thereof is directly connected with a first clock signal terminal, and a source thereof is directly connected with the output terminal;
a fourth transistor, a gate thereof is directly connected with a second clock signal terminal, a drain thereof is directly connected with the output terminal, and a source thereof is directly connected with a low level terminal;
a fifth transistor, a drain thereof is directly connected with the drain of the second transistor, and a source thereof is directly connected with the low level terminal;
a sixth transistor, a gate thereof is directly connected with a gate of the fifth transistor, a drain thereof is directly connected with the drain of the fourth transistor, and a source thereof is directly connected with the source of the fourth transistor;
a voltage pulling-down control module directly connected with the second clock signal terminal, the low level terminal, the gate of the fifth transistor, the source of the first transistor, a frame start signal and a third level terminal, wherein in the case that the frame start signal terminal and the third level terminal of the voltage pulling-down module are at high levels simultaneously, the voltage pulling-down control module outputs a high level at the gate of the fifth transistor, and the fifth transistor is in a turn-on state so as to pull down a gate voltage of the third transistor, and the sixth transistor is also in the turn-on state so as to pull down a voltage at the output terminal, wherein, for a group from a second shift register unit to a last but one shift register unit of the plurality of shift register units directly connected in cascade, the output terminal of each shift register unit of the group is directly connected with the signal input terminal of the next shift register unit adjacent thereto, the resetting terminal of each shift register unit of the group is directly connected with the output terminal of the next shift register unit adjacent thereto, and the frame start signal terminal of each shift register unit of the group is directly connected with the respective third level terminal, the third level terminal of a first shift register unit of the plurality of shift register units directly connected in cascade is directly connected with the second level terminal, the resetting terminal of the first shift register unit is directly connected with the output terminal of the next shift register unit adjacent thereto, and the third level terminal of a last shift register unit of the plurality of shift register units directly connected in cascade is directly connected with the first level terminal.

10. The shift register circuit of claim 7, wherein the voltage pulling-down control module comprises:
a seventh transistor, a gate thereof being connected with the frame start signal terminal, and a drain thereof being connected with the third level terminal;
an eighth transistor, a gate and a drain thereof being connected with the second clock signal terminal;
a ninth transistor, a gate thereof being connected with the source of the first transistor, a drain thereof being connected with a source of the eighth transistor, and a source of the ninth transistor being connected with the low level terminal;
a tenth transistor, a gate thereof being connected with the source of the eighth transistor, a drain thereof being connected with the second clock signal terminal, and a source thereof being connected with a source of the seventh transistor;

an eleventh transistor, a gate thereof being connected with the gate of the ninth transistor, a drain of the eleventh transistor being connected with the source of the tenth transistor, and a source thereof being connected with the low level terminal.

11. The shift register circuit of claim 7, wherein, in each of the shift register units, the first transistor has a same size as that of the second transistor.

12. The shift register circuit of claim 11, wherein, in each of the shift register units, the second level terminal is at a low level when the first level terminal is at a high level, or the second level terminal is at the high level when the first level terminal is at the low level.

13. The shift register circuit of claim 11, wherein, in each of the shift register units, a clock signal at the second clock signal terminal and a clock signal at the first clock signal terminal has a phase difference of 180.

14. The shift register circuit of claim 11, wherein, in each of the shift register units, both the clock signal at the first clock signal terminal and the clock signal at the second clock signal terminal output high levels during one half of their respective operation periods of time, and output low levels during the other half of their respective operation periods of time.

* * * * *